(12) United States Patent
Gur et al.

(10) Patent No.: US 8,093,494 B2
(45) Date of Patent: Jan. 10, 2012

(54) METHODS OF MAKING FUNCTIONALIZED NANORODS

(75) Inventors: Ilan Gur, San Francisco, CA (US); Delia Milliron, Berkeley, CA (US); A. Paul Alivisatos, Oakland, CA (US); Haitao Liu, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 609 days.

(21) Appl. No.: 11/667,101

(22) PCT Filed: Nov. 10, 2005

(86) PCT No.: PCT/US2005/041050
§ 371 (c)(1),
(2), (4) Date: Oct. 29, 2007

(87) PCT Pub. No.: WO2006/137940
PCT Pub. Date: Dec. 28, 2006

(65) Prior Publication Data
US 2008/0202579 A1 Aug. 28, 2008

Related U.S. Application Data

(60) Provisional application No. 60/626,718, filed on Nov. 10, 2004.

(51) Int. Cl.
*H01L 31/04* (2006.01)
*B05D 1/36* (2006.01)
*B32B 15/08* (2006.01)

(52) U.S. Cl. .......... 136/263; 136/252; 136/256; 438/63; 438/407; 438/404

(58) Field of Classification Search .......... 136/252, 136/256, 263; 438/63
See application file for complete search history.

(56) References Cited

U.S. PATENT DOCUMENTS

| 5,751,018 A * | 5/1998 | Alivisatos et al. ............. 257/64 |
| 6,225,198 B1 | 5/2001 | Alivisatos et al. |
| 6,322,901 B1 | 11/2001 | Bawendi et al. |
| 6,607,829 B1 | 8/2003 | Bawendi et al. |
| 2003/0145779 A1 | 8/2003 | Alivisatos et al. |
| 2004/0118448 A1* | 6/2004 | Scher et al. ................ 136/252 |

OTHER PUBLICATIONS

Mokari et al., "Selective growth of metal tips on quantum dots and tetrapods", Science, 2004.*

(Continued)

*Primary Examiner* — Jennifer K. Michener
*Assistant Examiner* — Matthew Martin
(74) *Attorney, Agent, or Firm* — Kilpatrick Townsend & Stockton LLP.

(57) ABSTRACT

A process for forming functionalized nanorods. The process includes providing a substrate, modifying the substrate by depositing a self-assembled monolayer of a bi-functional molecule on the substrate, wherein the monolayer is chosen such that one side of the bi-functional molecule binds to the substrate surface and the other side shows an independent affinity for binding to a nanocrystal surface, so as to form a modified substrate. The process further includes contacting the modified substrate with a solution containing nanocrystal colloids, forming a bound monolayer of nanocrystals on the substrate surface, depositing a polymer layer over the monolayer of nanocrystals to partially cover the monolayer of nanocrystals, so as to leave a layer of exposed nanocrystals, functionalizing the exposed nanocrystals, to form functionalized nanocrystals, and then releasing the functionalized nanocrystals from the substrate.

13 Claims, 7 Drawing Sheets

OTHER PUBLICATIONS

Love, "Fabrication and Wetting Properties of Hetallic Half-Shells with Submicron Diameters", Nano Letters, 2002.*

Alivisatos, A. P. et al., "Organization of 'nanocrystal molecules' using DNA," 1996, *Nature*, 382:609-611.

Alivisatos, A. P.,"Semiconductor Clusters, Nanocrystals, and Quantum Dots," *Science*, 271, 933-937, (1996).

Bawendi et al.. "The Quantum Mechanics of Larger Semiconductor Clusters ("Quantum Dots")" *Annu. Rev. Phys. Chem.* 1990, 41, 477-496.

M. T. Bjork et al. "One-dimensional Steeplechase for Electrons Realized," *Nano Letters*, 2 (2), 87-89, 2002.

Chamay, C. et al., "Reduced Symmetry Metallodielectric Nanoparticles: Chemical Synthesis and Plasmonic Properties," *J. Phys. Chem. B*, 107:7327-7333 (2003).

Crouch, D. et al., "New synthetic routes for quantum dots," *Philos. T. Roy Soc.* A 361:297-310 (2003).

Cui, et al., "Integration of Colloidal Nanocrystals in Lithographically Patterned Devices," 2004, *Nano Letters*, vol. 4, No. 6, 1093-1098.

Daniel, M. C. et al.; "Gold Nanoparticles: Assembly, Supramolecular Chemistry, Quantum-Size-Related Properties, and Applications toward Biology, Catalysis,and Nanotechnology," 2004, *Chem. Rev.* 104:293-346.

Gudiksen, M. S. et al., "Growth of Nanowire Superlattice Structures for Nanoscale Photonics and Electronics," *Nature* 415:617-620 (2002).

Li, et al., "Origin and Scaling of the Permanent Dipole Moment in CdSe Nanorods," 2003, Phys. Rev. Lett., vol. 90, No. 9, 097402-1-097402-4.

Love, J. C. et al., "Fabrication and Wetting Properties of Metallic Half Shells With Submicron Diameters," 2002, *Nano Lett.*, 2:891-894.

Loweth, C. J. et al., "DNA-Based Assembly of Gold Nanocrystals," 1999, *Angew. Chem. Int. Ed. Engl.*, 38:1808-1812.

Lu, Y. et al., "Asymmetric Dimers Can Be Formed by Dewetting Half-Shells of Gold Deposited on the Surfaces of Spherical Oxide Colloids," 2003, *J. Am. Chem. Soc.*, 125:12724-12725.

Manna, L. et al., "Synthesis of Soluble and Processable Rod-, Arrow-, Teardrop-, and Tetrapod-Shaped CdSe Nanocrystals," 2000, *J. Am. Chem. Soc.* 122:12700-12706.

Manna, L. et al., "Controlled Growth of Tetrapod-Branched Inorganic Nanocrystals," 2003, *Nature Mater.*, 2:382-385.

Mokari, T. et al., "Selective Growth of Metal Tips onto Semiconductor Quantum Rods and Tetrapods," 2004, *Science*, 304:1787-1790.

Murray, C. B. et al., "Synthesis and Characterization of Nearly Monodisperse CdE (E = S, Se, Te) Semiconductor Nanocrystallites," 1993, *J. Am. Chem. Soc.* 115:8706-8715.

Park, S. et al., "Self-Assembly of Mesoscopic, Metal-Polymer Amphiphiles," 2004, *Science* 303:348-351.

Peng, X. G. et al., "Synthesis and Isolation of a Homodimer of Cadmium Selenide Nanocrystals," 1997, *Angew. Chem. Int. Ed. Engl.*, 36:145-147.

Peng, X. G. et al., "Shape Control of CdSe Nanocrystals.," 2000, *Nature*, 404:59-61.

Puzder, et al., "The Effect of Organic Ligand Binding on the Growth of CdSe Nanoparticles Probed by the Ab Initio Calculations," 2004, *Nano Letters*, vol. 4, No. 12, 2361-2365.

Salem, A. K., et al., "Multifunctional Nanorods for Gene Delivery," 2003, *Nature Mater.* 2:668-671.

Wu, Y. et al., "Block-by-Block Growth of Single-Crystalline Si/SiGe Superlattice Nanowires," 2002, *Nano Lett.*, 2:83-86.

Yan, H. et al., "Morphogenesis of One-Dimensional ZnO Nano- and Microcrystals," 2003, *Adv. Mater.*, 15, 5:402-405.

* cited by examiner

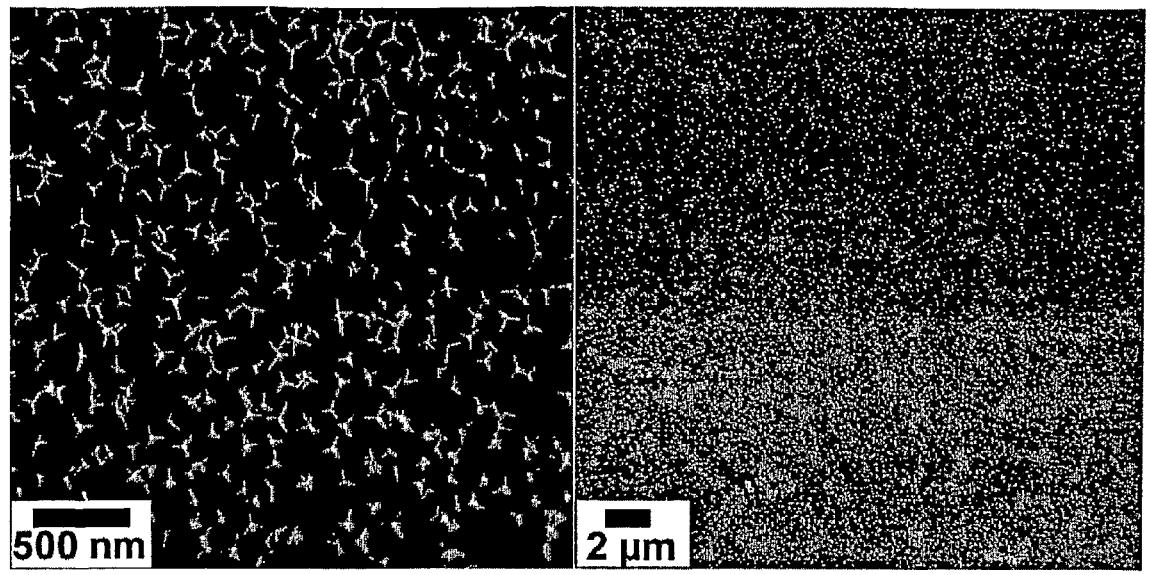
Fig.1A  Fig.1B
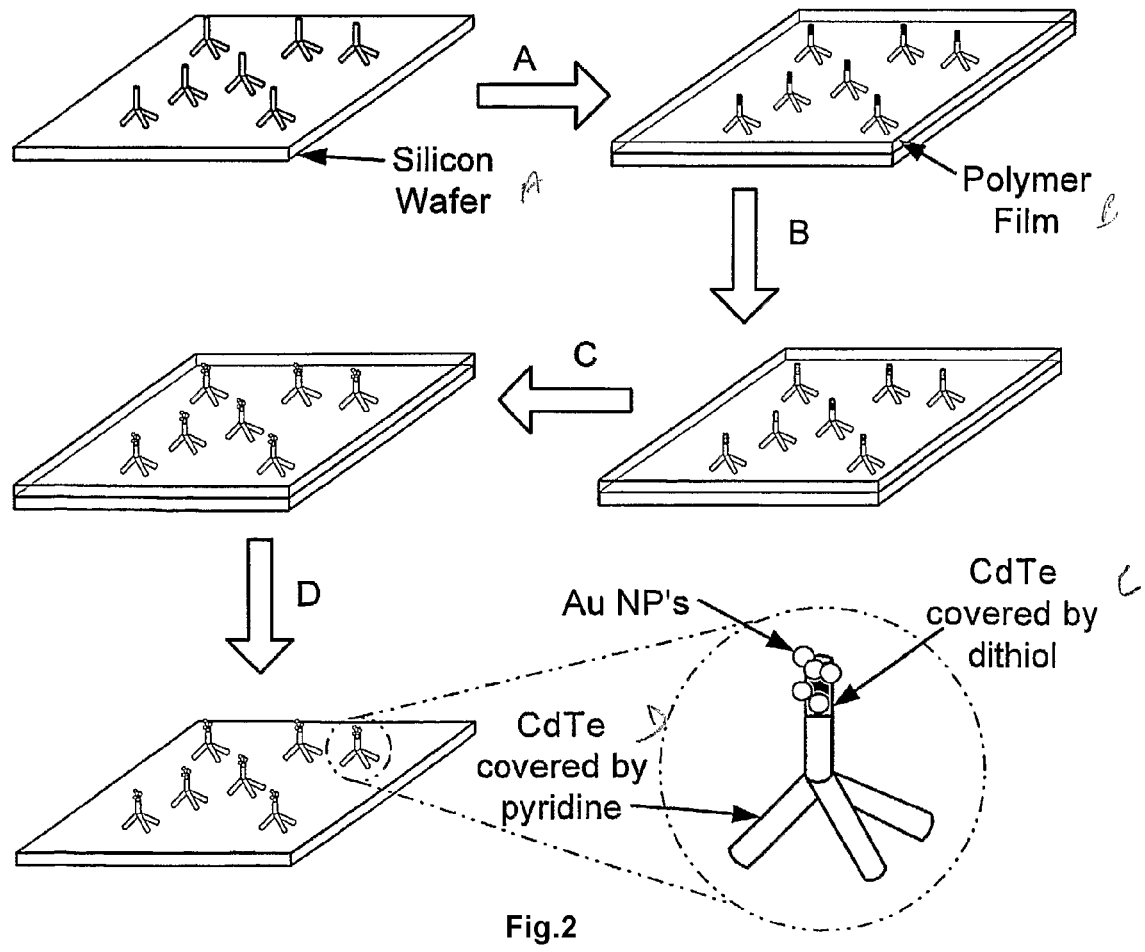
Fig.2

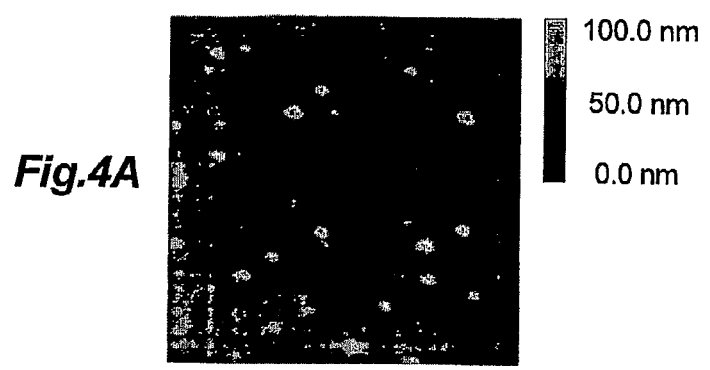
Fig.4A
Fig. 4B
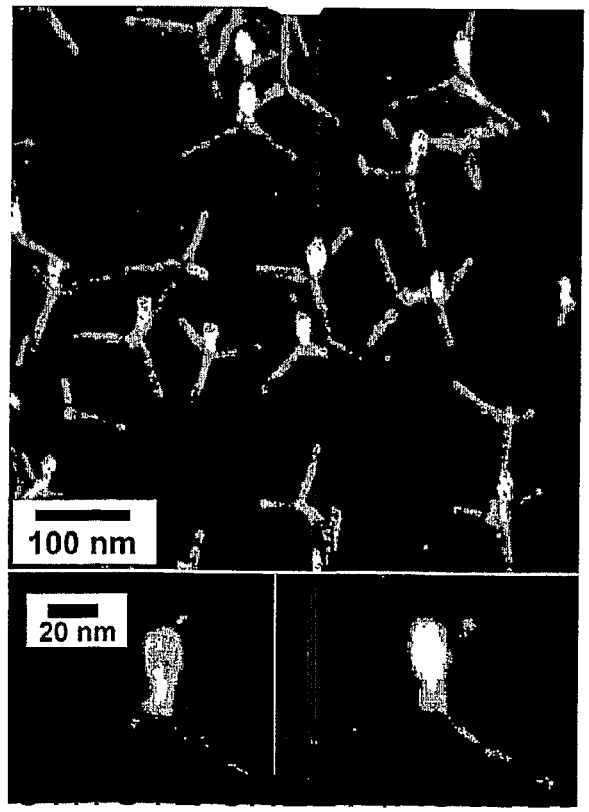
Fig.5A
Fig. 5B

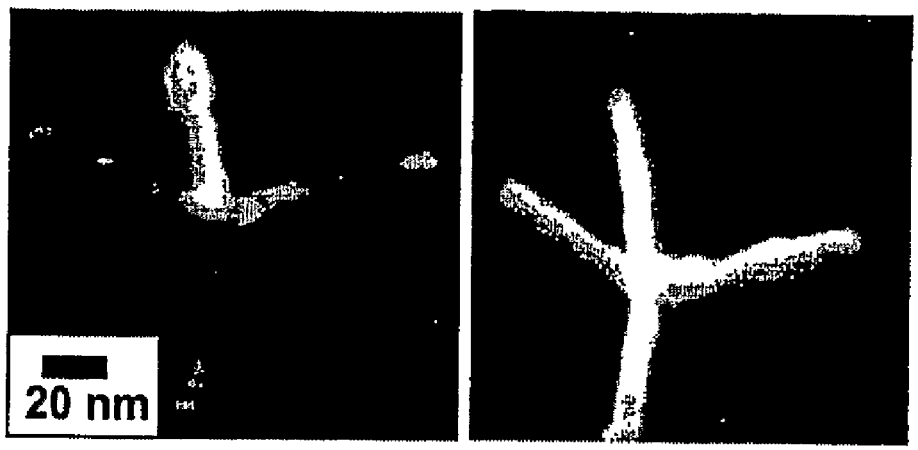
*Fig. 6A*  *Fig. 6B*
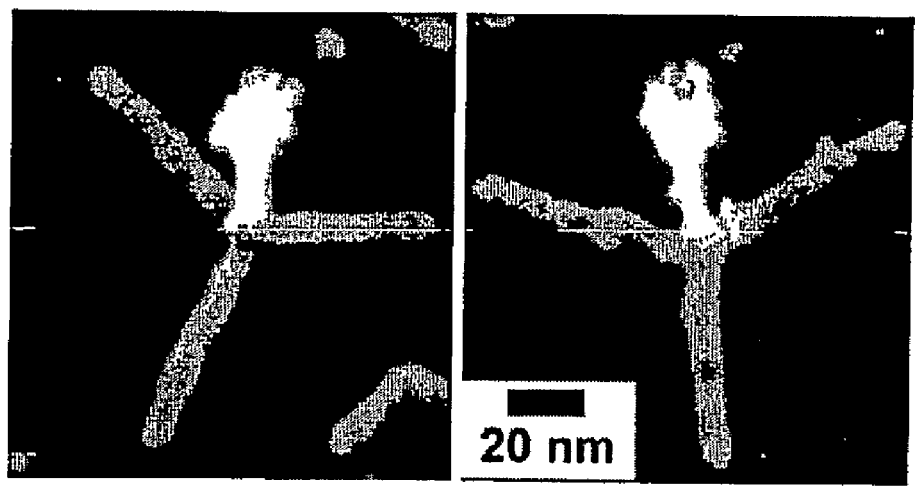
*Fig. 7A*  *Fig. 7B*

METHODS OF MAKING FUNCTIONALIZED NANORODS

CROSS-REFERENCES TO RELATED APPLICATIONS

This application claims priority to International Patent Application No. PCT/US2005/041050 filed Nov. 10, 2005 and U.S. Provisional Patent Application No. 60/626,718 filed Nov. 10, 2004, the disclosures of both of which are incorporated herein by reference.

STATEMENT AS TO RIGHTS TO INVENTIONS MADE UNDER FEDERALLY SPONSORED RESEARCH OR DEVELOPMENT

The invention described and claimed herein was made in part utilizing finds supplied by the United States Department of Energy under contract No. DE-ACO3-76SF00098, now DE-AC02-05CH11231 between the United States Department of Energy and The Regents of the University of California. The government has certain rights to the invention.

BACKGROUND OF THE INVENTION

The present invention relates to nanocrystals, and more particularly to functionalized nanorods formed from a controlled assembly of composite films containing colloidal nanocrystals in an organic host matrix.

Colloidal semiconductor nanocrystals are a field of study in modern nanoscale science and technology, (e.g., see Bawendi, M. G.; Steigerwald, M. L.; Brus, L. E. *Annu. Rev. Phys. Chem.* 1990, 41, 477-496 and Alivisatos, A. P. *Science* 1996, 271, 933-937). Among the various materials, colloidal CdSe quantum dots are undoubtedly the most studied, due to their tunable emission in the visible range, the advances in their preparation and their potential use in industrial and biomedical applications.

Recently, several advances in the synthesis of colloidal semiconductor nanocrystals have been made, allowing for size and shape control, (e.g., see Peng, X. G.; Manna, L.; Yang, W. D.; Wickham, J.; Scher, B.; Kadavanich, A.; Alivisatos, A. P. *Nature* 2000, 404, 59-61 and Manna, L.; Scher, E. C.; Alivisatos, A. P. *J. Am. Chem. Soc.* 2000, 122, 12700-12706). Of particular interest in this respect is the ability to obtain quantum confined wurtzite CdSe nanorods with a narrow distribution of lengths and diameters. Well-characterized samples of CdSe nanorods have become a model system to study theories of quantum confinement: for instance, it has been demonstrated, both theoretically and experimentally, that they emit linearly polarized light along the c-axis and that the degree of polarization is dependent on the aspect ratio of the particles. Semiconductor nanorods are of particular interest because of their applications in light emitting diodes, in low-cost photovoltaic devices, their propensity to form liquid crystalline phases and their use as barcodes for analytical purposes.

The preparation of a coated semiconductor nanocrystal may be found in U.S. Pat. Nos. 6,607,829 and 6,322,901, the disclosures of which are incorporated by reference herein in their entirety for all purposes. U.S. Pat. No. 6,225,198, the disclosure of which is hereby incorporated by reference herein in its entirety for all purposes, discloses processes for forming Group II-VI semiconductor nanocrystals and rod-like structures by contacting the semiconductor nanocrystal precursors with a liquid media comprising a binary mixture of phosphorous-containing organic surfactants.

Asymmetry is a common feature of the building blocks in many self-assembled structures. For example, phospholipids, molecules that have polar groups on one end and non-polar ones on the other, are basic building blocks for cell membranes. The asymmetry in hydrophilicity enables them to self-assemble into bilayer structures in water. Another example is diblock copolymers, which can self-assemble into different morphologies such as spheres, cylinders, and lamellae. In this case, the self-assembly depends not only on the existence of asymmetry, i.e. the two different blocks, but also on the degree of asymmetry, which is the volume ratio between them.

In the field of nanoscience, the ability to build controlled nanocrystal assemblies, or "artificial molecules" (e.g., see Alivisatos, A. P. et al., *Nature* 382:609-611 (1996); Peng, X. G. et al., *Angew. Chem. Int. Ed. Engl.* 36:145-147 (1997); Loweth, C. J. et al., *Angew. Chem. Int. Ed. Engl.* 38:1808-1812 (1999)) from nanocrystal "artificial atoms" allows one to mimic the molecular world in a much larger dimension. State of the art nanomaterial syntheses can now produce colloidal nanocrystals with controlled sizes, shapes, and compositions (e.g., see Daniel, M. C. et al.; *Chem. Rev.* 104:293-346 (2004); Crouch, D. et al., *Philos. T. Roy Soc. A* 361:297-310 (2003)). However, only highly symmetric nanocrystals, such as spheres (e.g., see Murray, C. B. et al., *J. Am. Chem. Soc.* 115:8706-8715 (1993)) rods (e.g., see Peng, X. G. et al., *Nature* 404:59-61 (2000); Manna, L. et al., *J. Am. Chem. Soc.* 122:12700-12706 (2000)) and more recently tetrapods (e.g., see Manna, L. et al., *Nature Mater.* 2:382-385 (2003)) have been studied. Nanometer sized materials of greater complexity can be built with components of lower symmetry, offering the possibility of creating materials with a higher level of integrated functionality.

Asymmetric nanostructures are more versatile building blocks compared to their symmetric counterparts. For example, when a gold nanoparticle ("NP") is asymmetrically modified with only one single strand DNA (ssDNA), it can be used as a building block for preparing more complex structures such as dimers and trimers (e.g., see Alivisatos, A. P. et al., *Nature* 382:609-611 (1996); Peng, X. G. et al., *Angew. Chem. Int. Ed. Engl.* 36:145-147 (1997); Loweth, C. J. et al., *Angew. Chem. Int. Ed. Engl.* 38:1808-1812 (1999)). Recently, it has been shown that asymmetric diblock Au-polymer nanorods can self-assemble into bundles, tubes, and sheets. The degree of asymmetry of the nanorods, which is the length ratio of the two blocks, determines the final assembled structure, similar to the case of the diblock copolymer.

Some asymmetric structures have been prepared using post synthesis modifications. For example, gold half-shell structures were produced by evaporating gold onto an array of silica colloidal particles (e.g., see Love, J. C. et al., *Nano Lett.* 2:891-894 (2002)). Heat treatment of these structures gave gold-metal oxide asymmetric dimers (e.g., see Lu, Y. et al., *J. Am. Chem. Soc.* 125:12724-12725 (2003)). In a similar approach, gold shell structures have been grown from Au NP seeds on a silica surface to produce gold cups or caps (e.g., see Charnay, C. et al., *J. Phys. Chem. B* 107:7327-7333 (2003)). Direct synthesis of asymmetric structures has also been realized in nanowire systems using chemical vapor deposition (e.g., see Wu, Y. et al., *Nano Lett.* 2:83-86 (2002); Gudiksen, M. S. et al., *Nature* 415:617-620 (2002); Bjork, M. T., et al., *Nano Lett.:* 2:87-89 (2002)). Similarly, asymmetric rods can be prepared using template directed growth (Park, S. et al., *Science* 303:348-351 (2004); Salem, A. K., et al., *Nature Mater.* 2:668-671 (2003)).

In many of the above examples, relatively large particles were prepared. For example, the gold-metal oxide asymmetric dimers can only be prepared from metal oxide particles larger than 200 nm; or the gold-polymer asymmetric nanorods have diameters around 200 nm and lengths over one micrometer. As a result, they can only be used to prepare assemblies in micrometer or even larger dimensions. To prepare sub-micrometer sized assemblies, smaller asymmetric building blocks are needed. Furthermore, it is desirable to develop a range of methods that can yield such structures.

There is therefore a need for developing a range of methods that can produce sub-micrometer sized asymmetric building blocks to prepare sub-micrometer sized assemblies.

BRIEF SUMMARY OF THE INVENTION

The present invention provides process for forming functionalized nanorods. The process includes providing a substrate, modifying the substrate by depositing a self-assembled monolayer of a bi-functional molecule on the substrate, wherein the monolayer is chosen such that one side of the bi-functional molecule binds to the substrate surface and the other side shows an independent affinity for binding to a nanocrystal surface, so as to form a modified substrate. The process further includes contacting the modified substrate with a solution containing nanocrystal colloids, forming a bound monolayer of nanocrystals on the substrate surface, depositing a polymer layer over the monolayer of nanocrystals to partially cover the monolayer of nanocrystals, so as to leave a layer of exposed nanocrystals, functionalizing the exposed nanocrystals, to form functionalized nanocrystals, and then releasing the functionalized nanocrystals from the substrate.

In one embodiment, ordered composites of cadmium telluride (CdTe) nanocrystals and poly(3-hexylthiophene) were assembled on both gold and indium tin oxide substrates via stepwise solution deposition. Modification of substrates with bi-functional linker molecules allowed for self-assembly of bound nanocrystal monolayers. A polymer was then spin cast from a solvent, filling gaps in the nanocrystal monolayer and yielding the composite film. It was discovered that nanocrystal dispersion in such films is governed by the coverage of the original nanocrystal monolayer, which can be controlled via choice of linker molecule and deposition parameters. Another degree of control arises from the ability to vary the thickness of the polymer layer that is deposited within the interstices of the nanocrystal array.

In another embodiment, CdTe tetrapods have been deposited on a substrate, and partially coated with a protective polymer layer, exposing just one arm. The exposed arm was then decorated with Au nanoparticles in a site selective fashion. The modified arms were released from the remainder of the tetrapods, and released from the substrate, yielding CdTe nanorods asymmetrically modified with Au nanoparticles.

In another embodiment, the present invention provides a composition of matter. The composition of matter includes a substrate, a self-assembled monolayer of a bi-functional molecule disposed on the substrate, wherein the monolayer is chosen such that one side of the bi-functional molecule binds to the substrate surface and the other side shows an independent affinity for binding to a nanocrystal surface, so as to form a modified substrate. A bound monolayer of nanocrystals is disposed on the substrate surface, a polymer layer is disposed over the monolayer of nanocrystals to partially cover the monolayer of nanocrystals, so as to leave a layer of exposed nanocrystals, and a material is bound with the exposed nanocrystals. The material functionalizes the exposed nanocrystal and can be a metal, a metal cluster, a semiconductor, a chelate and combinations thereof.

In another embodiment, the present invention provides a photovoltaic device. The photovoltaic device includes a first electrode layer and a second electrode layer. Disposed between the first and second electrode layers is a nanocrystal-polymer composite film. The nanocrystal-polymer composite film includes a self-assembled monolayer of a bi-functional molecule disposed on the first electrode layer, wherein the monolayer is chosen such that one side of the bi-functional molecule binds to the surface of the first electrode and an available surface of the monolayer shows an independent affinity for binding to a nanocrystal surface; a bound layer of nanocrystals disposed on the available surface of the monolayer; a polymer layer disposed over the layer of nanocrystals to partially cover the layer of nanocrystals, so as to leave a layer of exposed nanocrystal, where the exposed nanocrystals are in contact with the second electrode layer.

For a further understanding of the nature and advantages of the invention, reference should be made to the following description taken in conjunction with the accompanying drawings.

BRIEF DESCRIPTION OF THE DRAWINGS

FIGS. 1A-B are Scanning Electron Microscope (SEM) images of a prepared tetrapod film on a Si wafer. FIG. 1A is a high resolution image showing individual tetrapods, where the top arms appear as bright spots. FIG. 1B is a low resolution image showing the large area homogenous film. Each tiny white spot corresponds to one tetrapod top arm.

FIG. 2 is a block diagram showing an exemplary process for the preparation of asymmetric functionalized tetrapods, in accordance with one embodiment of the present invention.

FIGS. 4A-B are AFM images showing in FIG. 4A tapping mode AFM height image of the tetrapods partially covered with polymer. The image size is 1 μm×1 μm. FIG. 4B is a 3D view of the AFM image. The vertical scale is 100 nm. The high spots correspond to exposed tetrapod top arms.

FIGS. 5A-B are SEM images (tilted 30 degrees) of as-prepared tetrapods on a Si surface. The top arms were modified with gold nanoparticles (NPs). FIG. 5A is a large area view. FIG. 5B shows selected high resolution images.

FIGS. 6A-B show SEM images of the results of control experiment. The results show that the modification is a chemical one. FIG. 6A is a SEM image of CdTe tetrapods after treating both with hexanedithiol and Au NPs. FIG. 6B is a SEM image of a CdTe tetrapod after treating only with Au NPs. The tetrapods were not modified with Au NPs in this case.

FIGS. 7A-B are SEM images of asymmetric tetrapods prepared using two cycles of hexanedithiol, Au NP modifications. There are many more Au NPs on the top arm compared to those in the FIGS. 5A-B.

DETAILED DESCRIPTION OF THE INVENTION

Figure 3:
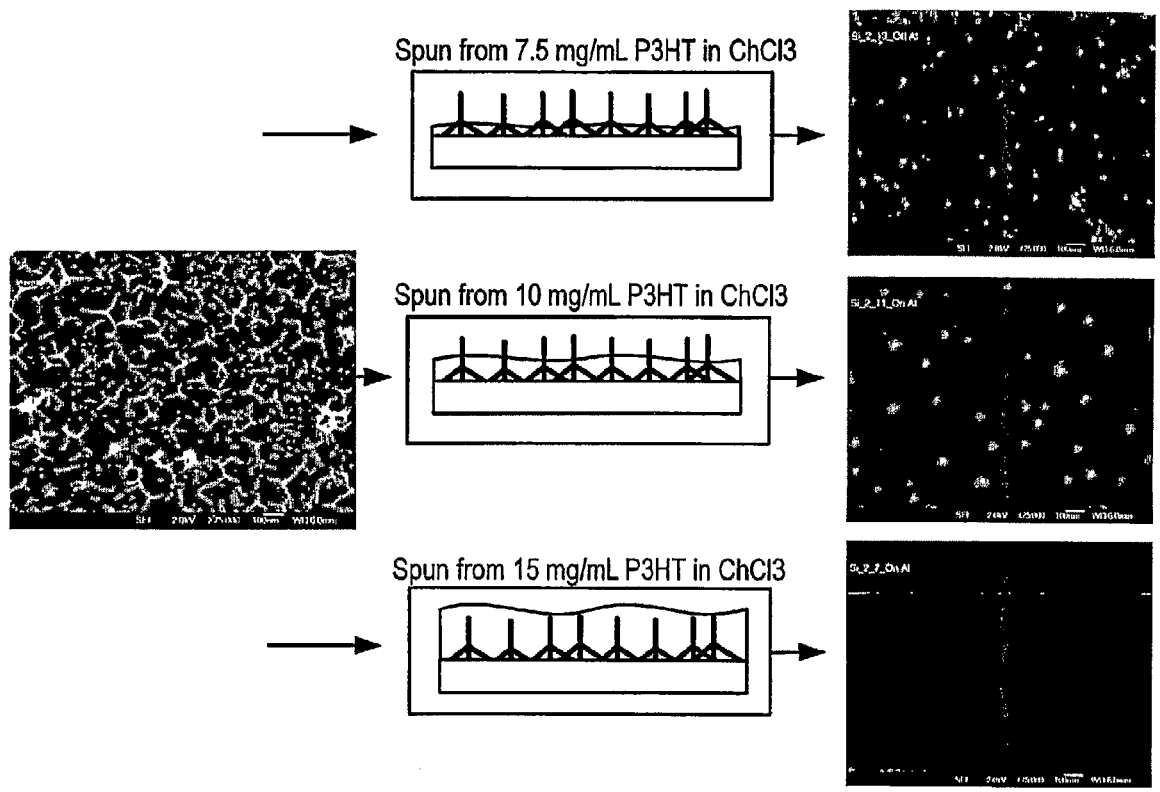
FIG. 3 is a composite image showing the structures of nanocrystal-polymer composite films with various thicknesses of the polymer layer.

The embodiments of the present invention provide a process for the controlled assembly of composite films containing colloidal nanocrystals in an organic host matrix. The nanocrystals may contain any number of materials, e.g. CdSe, CdTe, CdS, ZnS, In, Ins, Si, Au, or any number of shapes, e.g. rods, tetrapods, dipods, highly branched rods, inorganic dendrimers, spheres, and may contain more than one material in a core/shell or any other format. The organic host matrix may contain oligomers, polymers, and/or discreet molecules. Utilizing a multi-step deposition approach, in accordance with the embodiments of the present invention allows for the reliable and reproducible formation of highly dispersed nanocrystal polymer composite films on a variety of substrates, e.g. gold, indium-doped tin oxide, glass, Si and various others. One embodiment of the present invention is directed towards a method for making novel thin films where the degree of nanorod exposure may be controlled.

As used herein, "TOPO, TOP, TBP, HDA, HPA, ODPA and TDPA" are used to mean trioctyiphosphine oxide, trioctylphosphine, tri-n-butylphosphine, hexadecylamine, hexyiphosphonic acid, octadecylphosphonic acid, and tetradecyiphosphonic acid, respectively.

As used herein, "nanorod" and "semiconductor nanorod" are used to mean inorganic nanorods between about 1 nm and about 1000 nm in diameter, preferably between about 2 nm and about 50 nm, more preferably about 5 nm to about 20 nm (such as about 6, 7, 8, 9, 10, 11, 12, 13, 14, 15, 16, 17, 18, 19, or 20 nm). The nanorod or nanostructure can be a semiconductor material including, but not limited to, those of the group II-VI (ZnS, ZnSe, ZnTe, CdS, CdSe, CdTe, HgS, HgSe, HgTe, MgTe and the like) and III-V (GaN, GaP, GaAs, GaSb, InN, InP, InAs, InSb, AlAs, AlP, AlSb, AlS, and the like) and IV (Ge, Si, Pb and the like) materials, and an alloy thereof, or a mixture thereof. It is also understood that the term "semiconductor nanorod" may also include those nanorods that have other than a semiconductor core, i.e. those with a metal core.

In another aspect, the embodiments of the present invention relate to shaped nanorods. By "shaped nanorods" or "nanorods having a complex shape", it is meant to include those nanorods having other than a rod shape, such as those described in U.S. Patent Publication No. 20030145779 A1, filed Nov. 20, 2002, entitled "Shaped Nanocrystal Particles and Methods for Making the Same", the disclosure of which is incorporated herein by reference in its entirety for all purposes. Examples or nanorods with complex shapes include branched nanorods, tetrapods, arrows, teardrops, and rods having one, two, three or more arms of varying length.

One embodiment of the present invention is directed towards novel nanocrystals with selective functionalizations. In one embodiment the nanocrystal is a linear nanorod with a first end and a second end. In one embodiment the linear nanorod has an additional segment that extends linearly from the first end. In another arrangement the segment extends at an angle relative to the linear nanorod. In some arrangements the angle is either about 109° 71°. In another embodiment the nanocrystal is a tetrapod having four arms, each of which has a free end. In one arrangement there are four additional segments which extend linearly from the four tetrapod free ends. In another arrangement each of the four segments extends from the four tetrapod free ends at an angle relative to the tetrapod arms. In some arrangements each segment is positioned at about a 109° angle or a 71° angle.

In one embodiment, the nanocrystal contains a first semiconductor material and the additional segments contain a second semiconductor material. The first semiconductor material can be a Group II-VI compound, a Group II-V compound, a Group III-VI compound, a Group III-V compound, a Group II-VI compound, a Group I-III-VI compound, a Group II IV-VI compound, or a Group II-IV-V compound. The first semiconductor material may be chosen from ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof. The second semiconductor material can be ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof. Alternatively, the first and second semiconductor materials may be identical.

The nanocrystals and segments are tunable by changing the diameters of the nanocrystals and the diameters of the segments by parameters known to one of ordinary skill in the art. The segment can have a diameter that is smaller than the diameter of the nanocrystal. In other arrangements the segment can have a diameter that is larger than the diameter of the nanocrystal.

The methods and articles disclosed herein are applicable to any semiconductor known in the art, including various shaped nanocrystals, as discussed above. A tetrapod can be useful for its structure which is topologically similar to that of a sp (e.g., see Loweth, C. J. et al., *Angew. Chem. Int. Ed. Engl.* 38:1808-1812 (1999)) hybridized carbon atom. With the possibility to mimic the bonding between carbon atoms in organic molecules, this type of structure can serve as a building block to prepare superstructures, especially three dimensional ones. For example, one may modify each of the four arms differently, to produce a chiral "nanocrystal molecule." Another advantage of using tetrapods as building blocks lies in the fact that the dimension of tetrapods can be tuned over a wide range. For example, the arm length can be made from less then 20 nm to over 200 nm, while keeping the arm diameter unchanged. In addition, the tetragonal geometry of tetrapods assures alignment to promote charge transport to electrodes in a tetrapod-based solar cell, described below. These features makes it possible to use tetrapods to prepare structures over a wide range of sizes and complexities.

In accordance with one embodiment, a method of fabricating a nanocrystal-polymer composite film begins with a substrate, such as, for example, gold, indium-doped tin oxide, glass, silicon dioxide, or Si. The substrate surface is modified by deposition (using any technique) of a self-assembled monolayer (SAM) of a bi-functional linker molecule, chosen such that one end of the molecule binds to the substrate surface and the other end shows an independent affinity for binding to the specific nanocrystal surface. Thus one surface of the SAM binds to the substrate and the other surface of the SAM is available for binding to a nanocrystal. The choice of SAM depends on the particular nanocrystal composition that will be used in the nanocrystal-polymer composite film so that the nanocrystal will bind to the SAM. The coverage and dispersion of the nanocrystals on the SAM layer can be controlled by the choice of the SAM linker molecules. For example, hexane dithiol can be used for gold substrates; or a short-chain mercapto-functionalized carboxylic acid can be used for oxygenated substrates such as glass, indium-doped tin oxide, silicon dioxide, and so on; or a long-chain mercapto-functionalized carboxylic acid can be used for oxygenated substrates; or a mercapto-functionalized trimethoxysilane can be used for oxygenated substrates. It should be noted that these exemplary SAM linkers function such that one side is mercapto-functionalization (SH) to link to the nanoparticle while the other side binds the substrates. Other groups can be used to link to the nanoparticle as well (e.g. amines, phosphonic acids, etc.).

Immersing in or otherwise contacting the SAM surface of the modified substrate with a colloidal solution of nanocrystals can form a bound monolayer of nanocrystals on the SAM surface. The dispersion or aggregation of the nanocrystals on the surface (the nanocrystal array) can be controlled by careful choice of linker molecule in the SAM and deposition parameters. The nanocrystal array can be characterized easily by standard techniques (e.g. scanning electron microscopy), thus ascertaining the dispersion of the array is a simple and reliable task.

In one embodiment of the invention, the nanocrystals used to form the nanocrystal array are tetrapods. Because of the unique geometry of the tetrapods, three arms contact the surface and the last one points away from the surface. In one embodiment, when the tetrapods are first deposited, capillary force from solvent evaporation forces the tetrapods onto the surface, flattening the three arms that are pointing down towards the substrate. This effect has been visualized previously in experiments where the tetrapods were deposited to the side walls of trenches and could be viewed from the side. In another embodiment, the nanocrystals and nanorods are deposited using supercritical fluid, to avoid the strong capillary forces and form a nanocrystal array where the tetrapod arms are not flattened.

It should be noted that multilayer nanocrystal arrays can also be formed. After one nanocrystal array is deposited, the bound nanocrystals may be modified with a bi-functional molecule to which another nanocrystal layer may bind.

A polymeric organic component or protective polymer layer may then be deposited by a variety of techniques, such as for example by spin-casting, drop-casting, vapor deposition, etc., so as to fill the gaps in the nanocrystal array and thus yield the nanocrystal-polymer composite film. The protective polymer layer can be deposited to completely or only partially fill the nanocrystal array. The thickness of the protective polymer layer can be adjusted to achieve a desired filling of the nanocrystal array. The thickness of the protective polymer layer can be chosen to passivate all but a certain volumetric region or crystallographic face of a bound nanocrystal. Thus portions of the bound nanocrystals can be left exposed for interaction with the ambient environment and/or for a spatially selective chemical reaction. Various thicknesses of the protective polymer layer are shown in FIG. 3.

One embodiment of the present invention is directed towards the preparation of asymmetric nanorods, preferably tetrapods. When the nanocrystals in the nanocrystal array are tetrapods, the thickness of the protective polymer layer can be varied to control the exposed length of the one tetrapod arm that points away from the substrate. In one arrangement, at least a portion of the one exposed arm of the tetrapod is modified or functionalized with gold (Au) NPs. In another embodiment, asymmetrically modified CdTe nanorods are produced by releasing the structure from the underlying substrate. In one embodiment the asymmetrically modified CdTe nanorods are broken off from tetrapods. The structures prepared according to the embodiments of the present invention can be used as building blocks for more complex assemblies. Any small molecule known to those of skill in the art and having functional moieties capable of bonding with nanocrystals or nanorods is suitable for use in these embodiments.

It is known that it is difficult to characterize organic species on the semiconductor NP surface with nanometer spatial resolution using current instrumentation. However, use of NPs as tags allows one to use transmission electron microscopy (TEM) or scanning electron microscopy (SEM) to directly image the modified structures. In addition, the surface chemistry of gold is well known. Attaching gold particles to tetrapods provides a surface with unique chemical properties which can be used for further functionalization or preparation of nanostructure assemblies. In addition to modifying CdTe with Au NPs, preparation of CdSe nanorods and tetrapods with single Au nanoparticles directly attached to the ends is described in Mokari, T. et al., Science 304:1787-1790 (2004).

The embodiments of the present invention will be more fully appreciated by reference to the following example. However, the example is merely intended to illustrate further aspects of the invention and is not to be construed to limit the scope of the invention.

Example

An ordered nanocrystal-polymer composite film was fabricated using a stepwise solution deposition. Modification of both gold and indium tin oxide substrates with bi-functional linker molecules allowed for self-assembly of bound cadmium telluride (CdTe) nanocrystal monolayers. Polymer (poly(3-hexyithiophene)) was then spin cast from a solvent, filling gaps in the nanocrystal monolayer and yielding a nanocrystal-polymer composite film. Nanocrystal dispersion in such films is governed by the coverage of the original nanocrystal monolayer, which can be controlled via choice of linker molecule and deposition parameters. Another degree of control arises from the ability to vary the thickness of the polymer layer that is deposited within the interstices of the nanocrystal array.

One aspect of the present invention is directed towards the production of high density tetrapod films with minimum aggregation. Using slow evaporation of tetrapod solutions in pyridine produced uniform tetrapod coverage with almost no large aggregation over the range of 100 µm (FIG. 1). An area of roughly 3 µm×3 µm was analyzed to assess the nanocrystal array film quality. Of the total 360 nanocrystals (including tetrapod and non-tetrapod shaped particles) found, 288 (80%) of them were well separated from other particles. The other 72 particles overlapped one another to form small aggregates of 2 or 3 particles. Aggregation of more than 4 particles was not found. These results were quite unexpected.

A protective polymer layer was spin-coated to cover the bottom three tetrapod arms, exposing only part of the top arm (FIG. 2, step A). Non-limiting examples of polymer layer materials that can be used include poly(3-hexyl-thiophene) (P3HT) and poly(methyl methacrylate) (PMMA). Because P3HT is a semiconductor polymer, SEM can be used to characterize the surface before and after spin-coating. After an approximately 40 nm thick P3HT protective polymer layer was spin-coated, the bottom three tetrapod arms in the tetrapod-polymer composite film showed reduced contrast in SEM images, which suggested that they were covered by the protective polymer layer. Atomic force microscopy (AFM) was used to further characterize the tetrapod-polymer composite film. FIG. 4 shows the height image of the tetrapod-polymer surface. Separated dots can be found, which correspond to the exposed top arms. The heights of the dots roughly match the expected lengths of the exposed arms.

The tetrapod-polymer composite film was then treated with an isopropanol solution of hexanedithiol overnight to modify the exposed top arms (FIG. 2, step B). P3HT and PMMA are not soluble in isopropanol so the bottom three tetrapod arms remained covered by the protective polymer layer throughout this process. Thiol groups readily bind to the CdTe surface. In the case of hexanedithiol, one thiol group binds to the CdTe surface while the other one remains free.

Gold NPs coated with trioctylphosphine (TOP) were then used to modify the top arms via the dithiol linkers (FIG. 2, step C).

The TOP coated Au NP was synthesized by reducing HAuCl in the presence of TOP. HAuCl (97.6 mM in water, 1 mL) was mixed with tetraoctyl ammonium bromide (0.1 M in toluene, 4 mL) and toluene (4 mL). The mixture was stirred until the gold salt transferred to the toluene layer. The organic layer was then separated and dried using molecular sieve. The dried solution (1 mL) was mixed with toluene (4 mL) and TOP (20 tL). Lithium triethyl borohydride (1 M in THF, 1 mL) was injected into the mixture and the reaction was stirred in dark. The NPs were precipitated by adding methanol. After separating the precipitates from the supernatant, the precipitates were redissolved in toluene. The precipitation-redispersion was then repeated once. The NP solution was diluted with isopropanol (1:10 by mass) and used in the tetrapod modification. NPs coated with TOP instead of thiol were used because TOP can be easily replaced by the thiol groups. The diameters of the gold NPs and arms of the tetrapod used here were approximately 5 nm and 10 nm, respectively. Multiple gold NPs bound to the top CdTe tetrapod arms in this step, thus forming functionalized asymmetric tetrapods. After functionalizing the exposed arms of the tetrapods, the protective polymer layer was removed by dissolving it in an organic solvent such as chloroform (for P3HT) or pyridine (for PMMA) to expose the whole structure (FIG. 2, step D).

SEM and TEM were used to characterize the Au-functionalized asymmetric tetrapods. FIGS. 5-10 show images of the resulting asymmetric tetrapods that had used PMMA as the protective polymer layer. It can be clearly seen that the tips of the previously-exposed tetrapod arms have larger diameters than with the bottom arms, as a result of the attachment of Au NPs to the tips. Fine structure is revealed in higher resolution images, shown in FIG. 5B. Individual gold NPs can be seen on the top arm while the other three arms are clean. Similar results were obtained using P3HT as the protective polymer.

While not wishing to be bound by any particular theory or principle, it is postulated that the modification is indeed mediated by the dithiol linker instead of nonspecific adsorption. To demonstrate this, a silicon chip was spilt into two halves after deposition of tetrapods and spin-coating of the P3HT protective polymer layer. One half was treated with hexanedithiol solution and the other half was not. Both halves were then treated with Au NPs and the protective polymer layers were removed afterwards. Shown in FIGS. 6A-B, the sample treated with hexanedithiol shows successful asymmetric modification by gold NP binding (FIG. 6A) and sample without hexanedithiol treatment does not (FIG. 6B).

When two cycles of hexanedithiol and gold NP modifications were performed on the tetrapod-polymer composite film before the polymer protecting layer was removed two layers of gold NP shells were formed on the exposed top tetrapod arms. This is shown in FIG. 7A-B where a much larger cluster of gold NPs can be seen on the top tetrapod arms.

Figure 8:
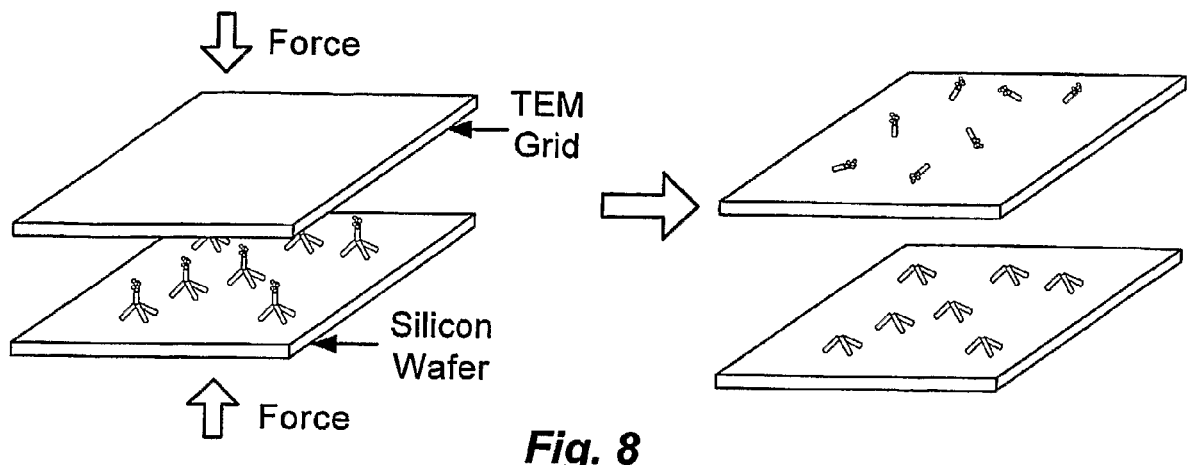
FIG. 8 is a block diagram showing an exemplary process where asymmetric tetrapods are broken to produce asymmetric rods.
Figure 9:
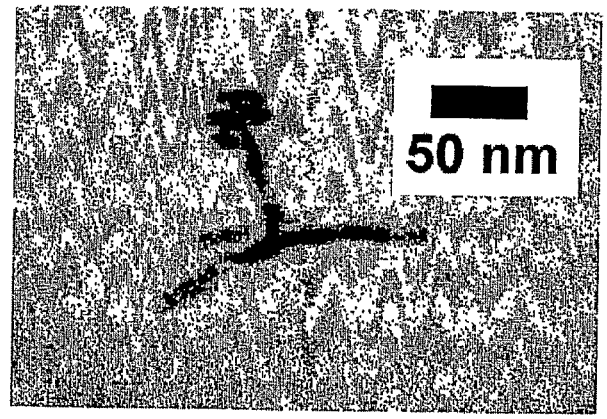
FIG. 9 is a transmission electron microscope (TEM) image of an asymmetric tetrapod.
Figure 10A:
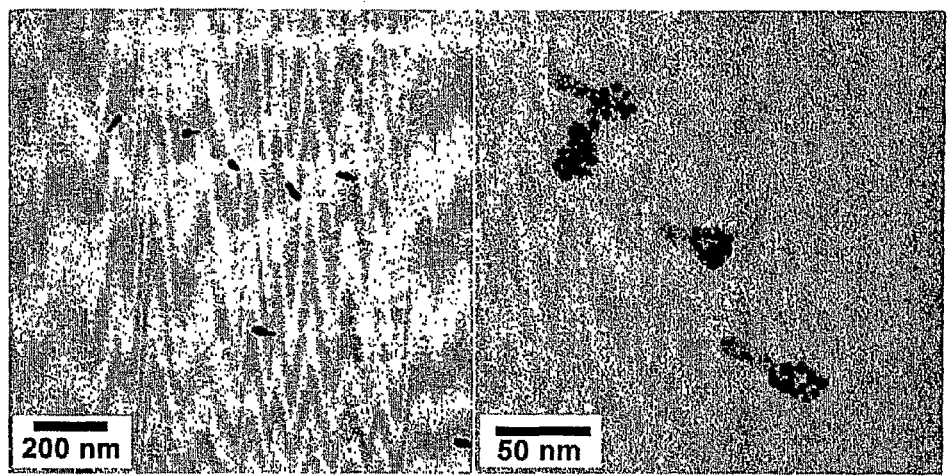
FIGS. 10A-B are TEM and SEM images of asymmetrically modified CdTe rods.
Figure 10B:
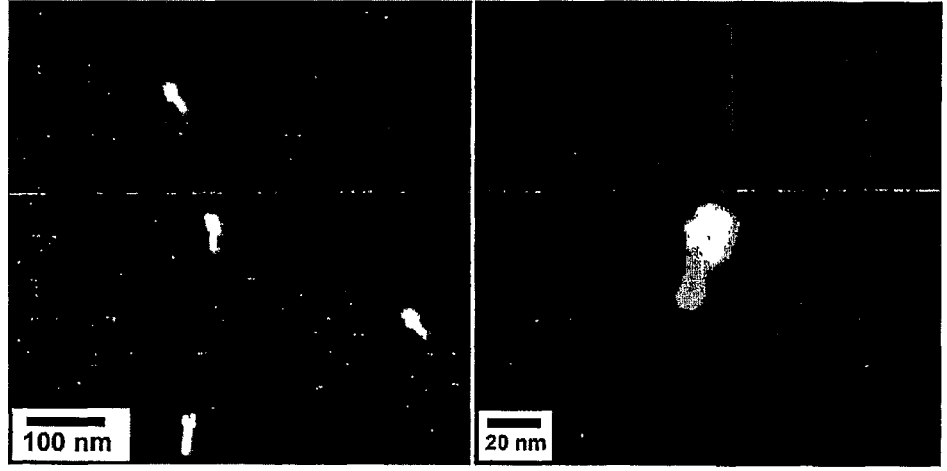

It may be desired to release the modified tetrapods intact from the substrate. This can be somewhat difficult, because of the very strong interaction between the tetrapods and the substrate as described above. To release the nanorods from the substrate, in one embodiment, a break and transfer process was used. The modified ends of the nanocrystals, e.g., tetrapods, were broken off by pressing a transfer overlayer onto the nanocrystals. The term "overlayer" is used here to mean a separate layer or sheet that is laid over the nanocrystal-polymer composite film and makes contact with at least a portion of the nanocrystals. In one example, a TEM grid was used as the overlay and was pressed onto the functionalized tetrapods (FIG. 8). As a result, particles were transferred to the TEM grid. Very few asymmetrically modified whole tetrapods were transferred to the grid (FIG. 9). Surprisingly, the majority of the particles on the TEM grid were nanorods (FIG. 10A, top left). Under higher magnification, it can be seen that the nanorods were asymmetrically modified with gold NPs (FIG. 10A, top right) as broken off from the tetrapods (FIG. 8) by the TEM grid. Among 260 CdTe nanoparticles found in 18 TEM images, 198 (76%) of them were asymmetrically modified with Au NPs, 62 (24%) were symmetrical or not modified. The break-and-transfer process can work using various other transfer overlayers, such clean substrates. FIG. 10B shows SEM images of the broken asymmetric CdTe nanorods transferred to a Si substrate.

The methods in accordance with the embodiments of the present invention enable the formation of novel semiconductor heterostructures. It should be understood that CdTe nanocrystal-Au particle heterostructures are only one example. Any metal capable of binding is suitable. Other possibilities include metal clusters, polymers, insulators, semiconductors, compounds such as chelates, and other particles of any functionality. Asymmetric nanorods can also be used as useful basic building blocks. For example, if functionalized by appropriate organic molecules on the gold (or other metal) NPs; they can be potentially made into nanocrystal amphiphiles. Furthermore, having been so modified, asymmetric nanocrystals exhibit anomalously large transient electric birefringence (e.g., see Yan, H. et al., *Adv. Mater.* 5:402-405 (2003)) and may have interesting non-linear optical properties.

The processes described in the embodiments of the present invention can be used to modify other tetrapod shaped nanocrystal, for example, CdSe (e.g., see Manna, L. et al., *J. Am. Chem. Soc.* 122:12700-12706 (2000)) and ZnO tetrapods (e.g., see Yan, H. et al., *Adv. Mater.* 5:402-405 (2003)). By using different material specific linker molecules, other NPs can also be modified or functionalized.

By combining various organic and nanocrystal materials via the techniques in accordance with the embodiments of the present invention a wide variety of novel and unique optical, electronic, and mechanical properties can be realized. Composites of semiconducting nanocrystal and electroactive organic materials are amongst the keys to the design and production of various optoelectronic devices such as LEDs and photovoltaic ("PV") cells. With the correct choice of materials, the design of structural composite thin films or piezoelectric thin films can be envisioned. In addition, the methods of the present invention enable the creation of films of passivated nanocrystals with selective regions or crystallographic faces exposed. Spatially selective chemical reactions can thus be carried out on the nanocrystals, which may ultimately allow for the formation of more complex nanocrystal shapes and structures. Additionally, since the exposed regions interact with the ambient, such structures are useful in sensing applications.

Figure 11:
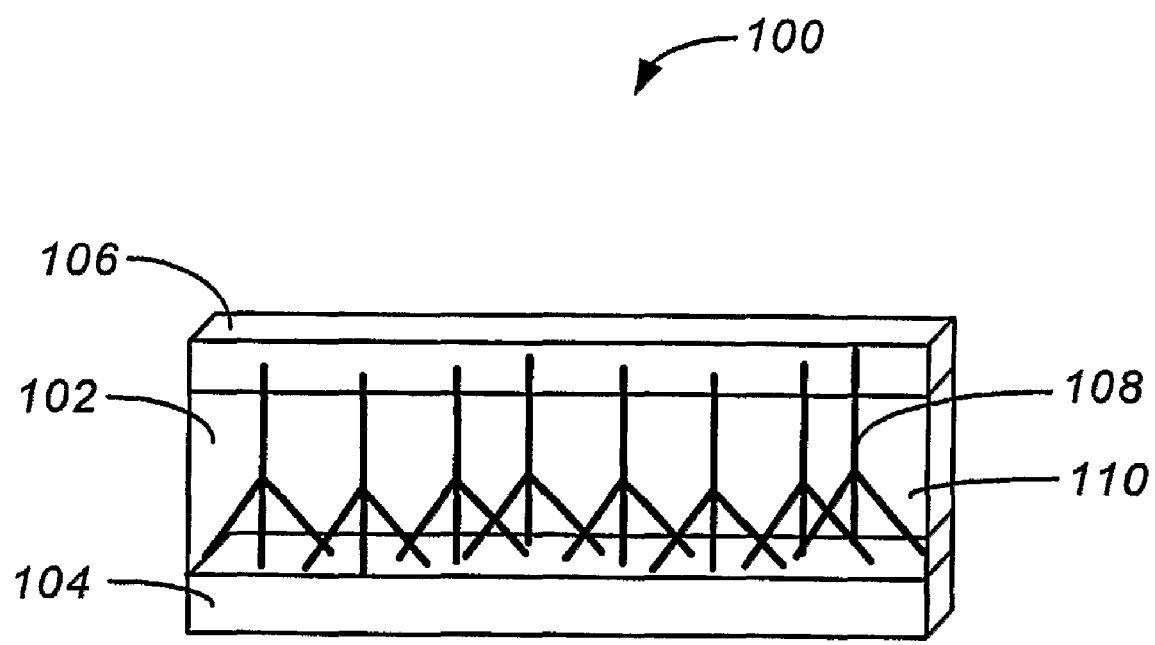
FIG. 11 is an exemplary diagram of a novel monolayer-based photovoltaic cell, in accordance with the embodiments of the present invention.

As set forth above, by combining various organic and nanocrystal materials, in accordance with the embodiments of the present invention, a novel monolayer-based photovoltaic cell can be made. Such a photovoltaic cell is shown in FIG. 11. In the exemplary PV cell 100 of FIG. 11, a composite layer 102 is disposed between a bottom electrode 104 and a top electrode 106. In the active layer, CdTe or other material (e.g. as set forth above) tetrapods 108 allow for aligned particles in a well defined, controllable, ordered array within the polymer matrix 110. The polymer matrix can be made of a material as described above. The tops of the tetrapods can be left exposed for the top metal electrode 106 to contact particles directly. It should be noted that the electrodes can be made of any material, such as for example, a reflective metal such as aluminum, calcium, nickel, copper, or gold, or a transparent conductive layer, such as indium titanium oxide.

As will be understood by those skilled in the art, the present invention may be embodied in other specific forms without departing from the essential characteristics thereof. For example, any one or more features of any embodiment of the invention may be combined with any one or more other features of any other embodiment of the invention, without departing from the scope of the invention. In addition, the terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. These other embodiments are intended to be included within the scope of the present invention, which is set forth in the following claims.

What is claimed is:

1. A process for producing sub-micron sized asymmetric structures, comprising:
    depositing a self-assembled monolayer onto a substrate, wherein an available surface of the self-assembled monolayer has an affinity for binding to a nanocrystal surface;
    contacting the available surface with a colloidal solution of nanocrystals to form a nanocrystal layer on the monolayer, wherein the nanocrystals are selected from the group consisting of Group II-VI, Group II-V, Group III-VI, Group III-V, Group I-III-VI, Group II-IV-VI, and Group II-IV-V compounds;
    depositing a protective polymer layer, the protective polymer layer covering a first portion of the nanocrystals, leaving a second portion of the nanocrystals exposed; and
    performing a functionalizing reaction on the second portion of the nanocrystals, to form asymmetric functionalized nanocrystals, wherein the functionalizing comprises
        treating the exposed second portion of nanocrystals with hexanedithiol to form hexanedithiol modified nanocrystals, and
        binding a material to the hexanedithiol modified nanocrystals, the material selected from the group consisting of a metal, a metal cluster, a polymer, an insulator, a semiconductor, a chelate and combinations thereof, thereby producing sub micron sized asymmetric structures.

2. The process as in claim 1 wherein the substrate comprises material selected from the group consisting of gold, indium-doped tin oxide, glass, silicon dioxide, and silicon.

3. The process as in claim 1 wherein the nanocrystals are selected from the group consisting of ZnS, ZnSe, ZnTe, CdS, CdSe, CdTe, HgS, HgSe, HgTe, AlN, AMP, AlAs, AlSb, GaN, GaP, GaAs, GaSb, GaSe, InN, InP, InAs, InSb, InS, TlN, TlP, TlAs, TlSb, PbS, PbSe, PbTe, and combinations thereof.

4. The process as in claim 1 wherein the nanocrystals comprise shapes selected from the group consisting of rods, tetrapods, dipods, highly branched rods, dendrimers, spheres, and combinations thereof.

5. The process as in claim 1 wherein the polymer layer contains organic molecules selected from the group consisting of oligomers, polymers, discreet molecules, and combinations thereof.

6. The process as in claim 1 wherein depositing the polymer layer comprises filling gaps in the nanocrystal layer.

7. The process of claim 1 wherein the functionalizing further comprises
    contacting trioctylphosphine coated gold nanoparticles with the hexanedithiol modified nanocrystals, thereby binding the gold nanoparticles to the nanocrystals.

8. The process of claim 1 further comprising releasing the functionalized nanocrystals, wherein the releasing comprises removing the polymer layer by dissolving the polymer layer in an organic solvent.

9. The process of claim 1 further comprising releasing the functionalized nanocrystals, wherein the releasing comprises pressing an overlay onto the exposed nanocrystals.

10. The process of claim 9 wherein the overlay is a transmission electron microscope grid.

11. A process for forming asymmetric functionalized nanorods, comprising:
    modifying a substrate by depositing a self-assembled monolayer of a bi-functional molecule on the substrate, wherein the monolayer is chosen such that one side of the bi-functional molecule binds to the substrate surface and the other side shows an independent affinity for binding to a nanocrystal surface, so as to form a modified substrate;
    contacting the modified substrate with a colloidal solution containing tetrapod shaped nanocrystals and wherein the solution of the nanocrystal colloids contains nanocrystals selected from the group consisting of ZnS, ZnSe, ZnTe, CdS, CdSe, CdTe, HgS, HgSe, HgTe, AlN, AMP, AlAs, AlSb, GaN, GaP, GaAs, GaSb, GaSe, InN, InP, InAs, InSb, InS, TlN, TlP, TlAs, TlSb, PbS, PbSe, PbTe, and combinations thereof;
    forming a bound monolayer of nanocrystals on the modified substrate surface;
    depositing a polymer layer over the monolayer of nanocrystals to partially cover the monolayer of nanocrystals, so as to leave a layer of exposed nanocrystals;
    functionalizing the exposed nanocrystals, to form asymmetric functionalized nanocrystals, wherein the functionalizing comprises
        treating the exposed second portion of nanocrystals with hexanedithiol to form hexanedithiol modified nanocrystals, and
        binding a material with the hexanedithiol modified nanocrystals, the material selected from the group consisting of a metal, a metal cluster, a polymer, an insulator, a semiconductor, a chelate and combinations thereof; and
    pressing a transmission electron microscope grid onto the exposed ends of the nanocrystals to collect functionalized nanorods having a diameter of from about 2 to about 50 nm, forming asymmetric functionalized nanorods.

12. The process of claim 11 wherein the functionalizing further comprises
    contacting trioctylphosphine coated gold nanoparticles with the hexanedithiol modified nanocrystals, thereby binding the gold nanoparticles to the nanocrystals.

13. The process of claim 1, wherein the nanocrystals are tetrapods.

* * * * *